United States Patent
Fujihara et al.

(10) Patent No.: US 9,795,034 B2
(45) Date of Patent: Oct. 17, 2017

(54) WIRING BOARD AND ELECTRONIC DEVICE

(71) Applicant: KYOCERA Corporation, Fushimi-ku, Kyoto-shi, Kyoto (JP)

(72) Inventors: Yukio Fujihara, Kyoto (JP); Kenjirou Fukuda, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 108 days.

(21) Appl. No.: 14/404,938

(22) PCT Filed: May 30, 2013

(86) PCT No.: PCT/JP2013/065112
§ 371 (c)(1),
(2) Date: Dec. 1, 2014

(87) PCT Pub. No.: WO2013/180247
PCT Pub. Date: Dec. 5, 2013

(65) Prior Publication Data
US 2015/0146397 A1    May 28, 2015

(30) Foreign Application Priority Data
May 30, 2012 (JP) ................... 2012-123293

(51) Int. Cl.
H05K 1/00 (2006.01)
H05K 1/11 (2006.01)
(Continued)

(52) U.S. Cl.
CPC .............. H05K 1/111 (2013.01); H01L 33/62 (2013.01); H05K 1/181 (2013.01); H01L 33/486 (2013.01);
(Continued)

(58) Field of Classification Search
CPC .......... H05K 1/02; H05K 2201/09036; H05K 1/111; H05K 1/112; H05K 1/117
(Continued)

(56) References Cited

U.S. PATENT DOCUMENTS

2006/0279367 A1* 12/2006 Knecht ............... H03B 5/32
                                              331/107 A
2009/0174291 A1    7/2009 Nagano et al.
2011/0114353 A1    5/2011 Iizuka et al.

FOREIGN PATENT DOCUMENTS

CN   101790787 A    7/2010
JP   2001-308490 A  11/2001
(Continued)

OTHER PUBLICATIONS

International Search Report dated Aug. 13, 2013 issued for counterpart International Application No. PCT/JP2013/065112.
Office Action dated Jul. 26, 2016 issued by the Japanese Patent Office in corresponding Japanese Patent Application No. 2014-518742.
(Continued)

*Primary Examiner* — Binh Tran
(74) *Attorney, Agent, or Firm* — Procopio Cory Hargreaves and Savitch LLP

(57) ABSTRACT

There is provided a wiring board capable of strengthening the bonding between an external terminal and a wiring of an external circuit board. A wiring board includes an insulating substrate having two main surfaces facing each other, side surfaces connecting to the two main surfaces and concave portions concave from the side surfaces and connecting to at least one of the two main surfaces; and external terminals disposed from one of the main surfaces to inner surfaces of the respective concave portions, each of the external terminals having a convex-shaped section disposed on one main surface side along each of the concave portions.

9 Claims, 7 Drawing Sheets

(51) Int. Cl.
  *H01L 33/62* (2010.01)
  *H05K 1/18* (2006.01)
  *H05K 7/12* (2006.01)
  *H05K 1/02* (2006.01)
  *H01L 33/48* (2010.01)

(52) U.S. Cl.
  CPC ............ *H01L 2224/48091* (2013.01); *H01L 2224/48227* (2013.01); *H01L 2924/15174* (2013.01); *H01L 2924/181* (2013.01); *H05K 1/02* (2013.01); *H05K 1/112* (2013.01); *H05K 1/117* (2013.01); *H05K 2201/0367* (2013.01); *H05K 2201/09036* (2013.01); *H05K 2201/0939* (2013.01); *Y02P 70/611* (2015.11)

(58) Field of Classification Search
  USPC .................................................. 361/748, 767
  See application file for complete search history.

(56) References Cited

FOREIGN PATENT DOCUMENTS

| | | |
|---|---|---|
| JP | 2005-051043 A | 2/2005 |
| JP | 2006-005027 A | 1/2006 |
| JP | 2009-141455 A | 6/2009 |
| JP | 2009-188374 A | 8/2009 |
| JP | 2009-188375 A | 8/2009 |
| JP | 2011-071373 A | 4/2011 |
| JP | 2011-199228 A | 10/2011 |

OTHER PUBLICATIONS

Office Action dated Aug. 16, 2016 issued by the Chinese Patent Office in corresponding Chinese Patent Application No. 201380028368.2.

* cited by examiner (a)

(b)

(a)

(b)

(a)

(b)

(a)

(b)

(a)

(b)

(a)

(b)

WIRING BOARD AND ELECTRONIC DEVICE

TECHNICAL FIELD

The present invention relates to a wiring board for mounting an electronic component and an electronic device.

BACKGROUND ART

In related art, a wiring board for mounting an electronic component includes an insulating substrate made of an electric insulating material and a conductor disposed in the insulating substrate.

The wiring board which has, for example, a concave portion (castellation) disposed from a side surface to a lower surface thereof and a conductor (castellation conductor) disposed from an inner surface of the concave portion to the lower surface of the wiring board to be used as an external terminal is known (for example, refer to Patent Literature 1).

CITATION LIST

Patent Literature

Patent Literature 1: Japanese Unexamined Patent Publication JP-A 2011-071373

SUMMARY OF INVENTION

Technical Problem

However, the concave portion and the external terminal have been miniaturized as the wiring board has been miniaturized in recent years. Accordingly, the bonding strength between the external terminal of the wiring board and an external circuit board is decreasing. This is because the external terminal and a bonding member are peeled off from an outer peripheral side of the wiring board in a bonding portion between the external terminal and the bonding member.

Solution to Problem

A wiring board according to an embodiment of the invention includes an insulating substrate having two main surfaces facing each other, side surfaces connecting to the two main surfaces and concave portions concave from the side surfaces and connecting to at least one of the two main surfaces; and external terminals disposed from one of the main surfaces to inner surfaces of the respective concave portions, each of the external terminals having a convex-shaped section disposed on one main surface side along each of the concave portions.

An electronic device according to the embodiment of the invention includes the wiring board having the above-mentioned structure; and an electronic component mounted on the wiring board.

Advantageous Effects of Invention

As the wiring board according to the embodiment of the invention includes an insulating substrate having two main surfaces facing each other, side surfaces connecting to the two main surfaces and concave portions concave from the side surfaces and connecting to at least one of the two main surfaces; and external terminals disposed from one of the main surfaces to inner surfaces of the respective concave portions, each of the external terminals having a convex-shaped section disposed on one main surface side along each of the concave portions, even in the case where a force in a direction horizontal to the main surface of the wiring board is applied to a bonding portion when the wiring board is bonded to an external circuit board, the stress applied to the external terminal is distributed by the convex-shaped section, and therefore, the possibility that the wiring board is peeled off from external circuit board can be reduced.

As the electronic device according to the embodiment of the invention includes the wiring board having the above-mentioned structure; and an electronic component mounted on the wiring board, the bonding strength between the electronic device and the external circuit board can be improved.

DESCRIPTION OF EMBODIMENTS

Some exemplary embodiments of the invention will be explained with reference to the accompanying drawings.

First Embodiment

Figure 1:
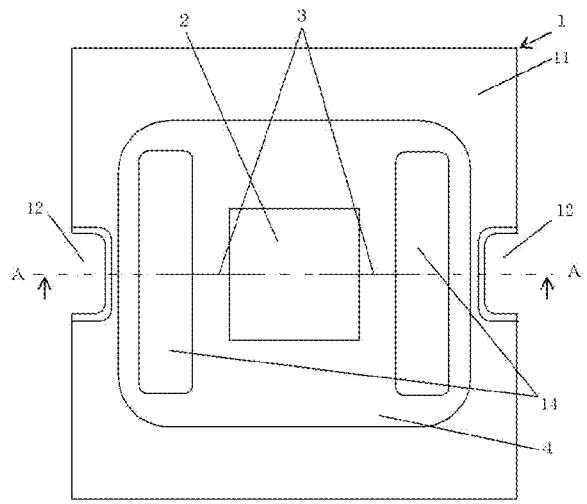
FIG. 1(a) is a top view showing a wiring board according to a first embodiment of the invention.
FIG. 1(b) is a bottom view of FIG. 1(a)
Figure 1:
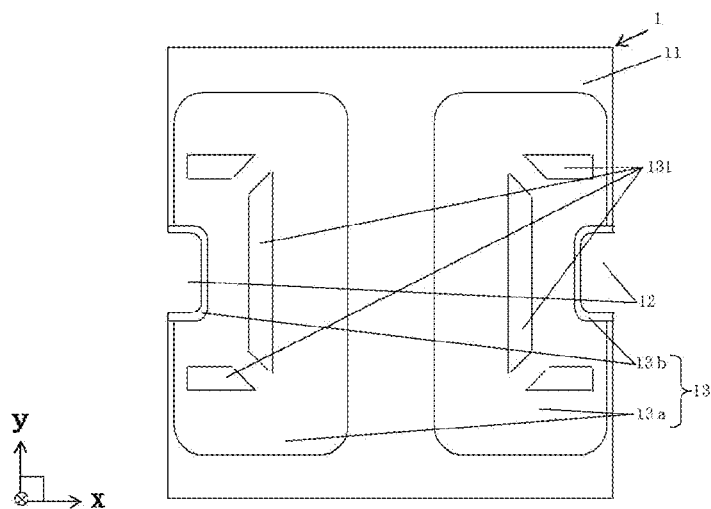
Figure 2:
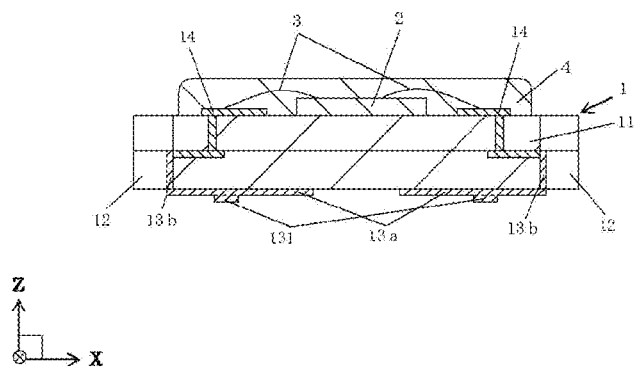
FIG. 2 is a cross sectional view taken along the line A-A of the wiring board shown in FIG. 1(a)
Figure 3:
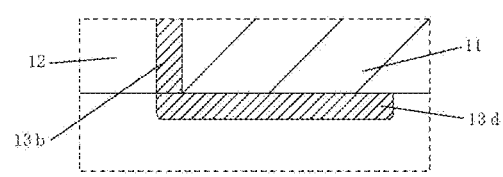
FIG. 3(a) and FIG. 3(b) are cross-sectional views showing a first manufacturing method of an external terminal of the wiring board according to the first embodiment of the invention.
Figure 3:
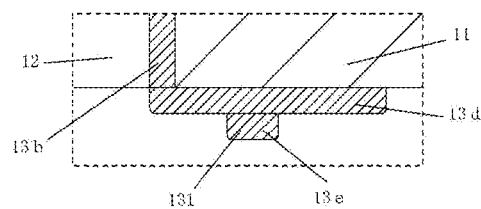
Figure 3:
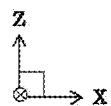
Figure 4:
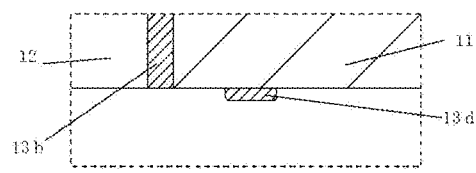
FIG. 4(a) and FIG. 4(b) are cross-sectional views showing a second manufacturing method of an external terminal of the wiring board according to the first embodiment of the invention.
Figure 4:
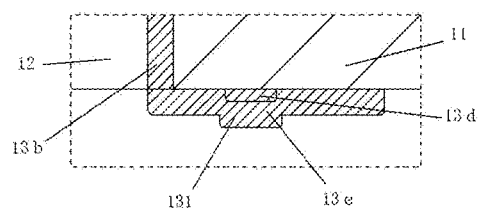
Figure 4:
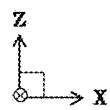
Figure 5:
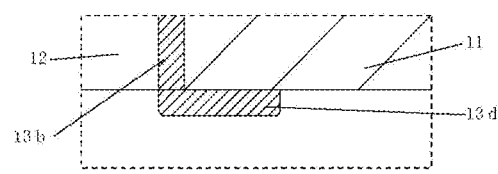
FIG. 5(a) and FIG. 5(b) are cross-sectional views showing a third manufacturing method of an external terminal of the wiring board according to the first embodiment of the invention.
Figure 5:
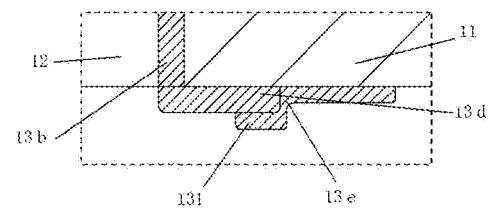
Figure 5:
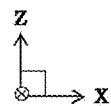

As shown in FIG. 1 and FIG. 2, an electronic device according to a first embodiment of the invention includes a wiring board 1 and an electronic component 2 disposed on an upper surface of the wiring board 1. The electronic device is mounted on a circuit board forming, for example, an electronic component module.

The wiring board 1 includes an insulating substrate 11 having two main surfaces facing each other, side surfaces connecting to the two main surfaces and concave portions 12 concave from the side surfaces and connecting to at least one of the two main surfaces, external terminals 13 disposed from one of the main surfaces to inner surfaces of the respective concave portions 12, each of the external terminals 13 having a convex-shaped section 131 disposed on one main surface side along each of the concave portions 12, and wiring conductors 14 disposed on the insulating substrate 11. In FIG. 1 and FIG. 2, the electronic device is mounted on an xy plane in a virtual xyz space. In FIG. 2 to FIG. 5, an upper direction indicates a positive direction of a virtual z-axis.

The insulating substrate 11 has an upper surface including a mounting area of the electronic component 2, having a rectangular plate shape in a plan view thereof. The insluting substrate 11 functions as a support for supporting the electronic component 2, and the electronic component 2 is adhered and fixed on the mounting area in the center of the upper surface through an adhesive such as a low-melting point brazing material or a conductive resin.

As the insulating substrate 11, for example, ceramics such as an aluminum oxide sintered body (alumina ceramics), an aluminum nitride sintered body, a mullite sintered body or a glass ceramics sintered body can be used.

When the insulating substrate 11 is fabricated by using a resin material, for example, an epoxy resin, a polyimide resin, an acrylic resin, a phenol resin, a polyester resin or fluorine-based resins including a tetrafluoroethylene resin can be used.

When the insulating substrate 11 is made of, for example, the aluminum oxide sintered body, a suitable organic binder, a solvent and so on are added and mixed to raw material powder of aluminum oxide, silicon oxide, magnesium oxide, calcium oxide and so on to thereby prepare a slurry. The slurry is formed to be a sheet shape by using a doctor blade method, a calender roll method or the like to obtain a ceramic green sheet. Then, a suitable punching process is performed to the ceramic green sheet and a plurality of ceramic green sheets are laminated and fired at a high temperature (approximately 1600° C.) to thereby fabricate the insulating substrate.

The concave portion 12 is provided on the side surface of the insulating substrate 11. The concave portion 12 may be provided from one main surface to the other main surface of the insulating substrate 11, or may be provided from a middle of the side surface to the main surface of the insulating substrate 11. Such concave portions 12 are formed by forming through holes to be the concave portions 12 in some of the ceramic green sheets for the insulating substrate 11 by a laser process or the punching process using a die.

The wiring conductor 14 is disposed on the surface and the inside of the insulating substrate 11, and the wiring conductor 14 is configured to electrically connect the electronic component 2 mounted on the wiring board 1 to the external circuit board. The wiring conductor 14 includes a wiring conductor disposed on the surface or the inside of the insulating substrate 11, and a through conductor electrically connecting the wiring conductors to each other which are vertically positioned by piercing an insulating layer constituting the insulating substrate 11.

The external terminal 13 includes a main surface area 13a provided on the main surface of the insulating substrate 11 and a side surface area 13b provided in the inner surface of the concave portion 12 on the side surface of the insulating substrate 11, and is provided from the main surface of the insulating substrate 11 to the inner surface of the concave portion 12.

As the external terminal 13 and the wiring conductor 14, metal materials such as tungsten (W), molybdenum (Mo), manganese (Mn), silver (Ag) or copper (Cu) can be used. For example, when the insulating substrate 11 is made of the aluminum oxide sintered body, a conductor paste obtained by adding and mixing a suitable organic binder, a solvent and so on to high-melting point metal powder such as W, Mo or Mn is printed and applied on the ceramic green sheet to be the insulating substrate 11 in a given pattern by a screen printing method, and is fired simultaneously with the ceramic green sheet to be the insulating substrate 11 to thereby deposit and form the external terminal and the wiring conductor at predetermined positions in the insulating substrate 11. When the wiring conductor 14 is the through conductor, the conductor is formed by forming a through hole by the punching process using a die or punching or the laser process and filling the through hole with the conductor paste for the wiring conductor 14 by a printing method. The side surface area 13b of the external terminal 13 is formed by printing and applying the conductor paste for the external terminal 13 on an area to be an inner surface of the through hole to be the concave portion 12.

The external terminal 13 and the wiring conductor 14 formed on a surface of the insulating substrate 11 can be formed by printing and applying a conductor paste obtained by adding and mixing a suitable organic binder and a solvent to metal powder such as copper or silver on the surface of the insulating substrate 11 into a given pattern by using the screen printing method in advance and firing the paste at a temperature (approximately 1000° C.) lower than the temperature at the time of firing the ceramic green sheet for the insulating substrate 11 to be baked on the surface of the insulating substrate 11. It is also preferable to deposit a metal material such as copper, gold, aluminum, nickel, chrome, molybdenum, titanium or an alloy of the above metals on the surface of the insulating substrate 11 by using a sputtering method, a deposition method or otherwise.

The convex-shaped section 131 protrudes by approximately 0.5 to 90 μm from the surface of the external terminal 13 around the convex-shaped section 131. The convex-shaped section 131 is disposed in an area closer to the concave portion 12 from the central portion of the main surface area 13a of the external terminal 13. As the external terminal 13 has the convex-shaped section 131, the bonding area between the external terminal 13 and the wiring of the external circuit board around the concave portions 12 can be increased. It is also possible to improve the bonding strength by forming a fillet around the convex-shaped section 131 easily.

Figure 6:
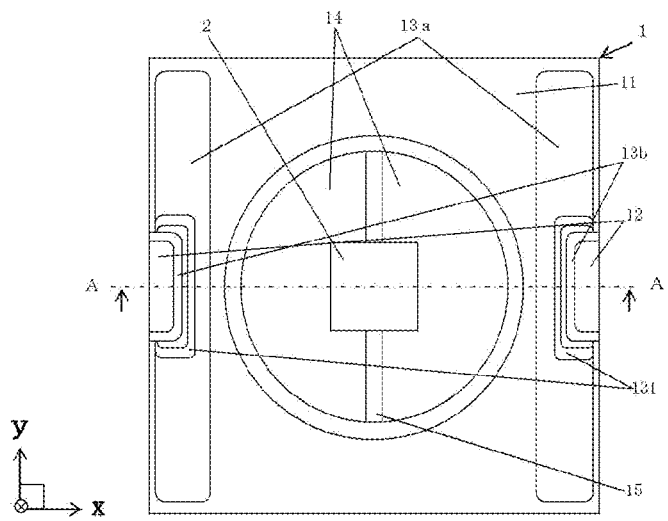
FIG. 6(a) is a top view showing a wiring board according to a second embodiment of the invention.
FIG. 6(b) is a cross-sectional view taken along the line A-A of FIG. 6(a)
Figure 6:
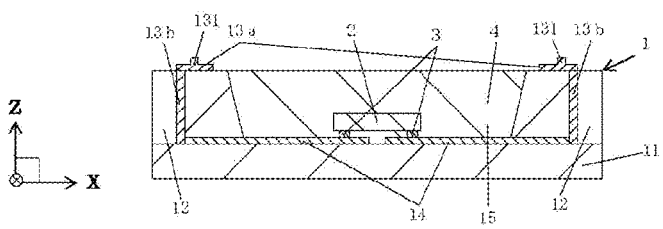
Figure 7:
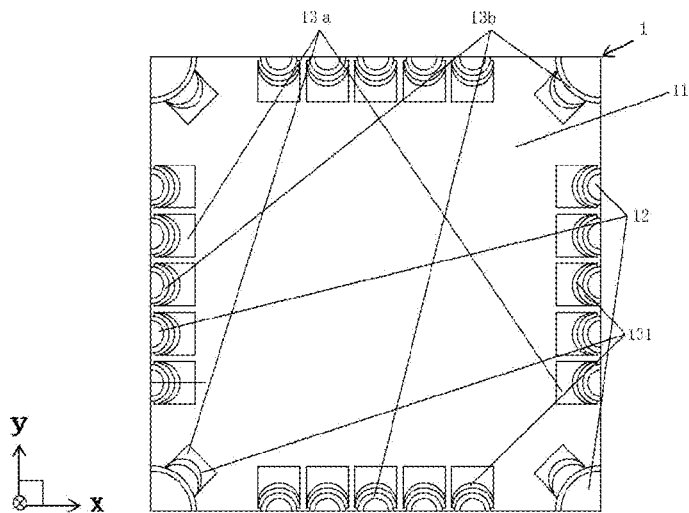
FIG. 7 is a bottom view showing a wiring board according to a third embodiment of the invention.

As in examples shown in FIG. 1, FIG. 6 and FIG. 7, when the convex-shaped section 131 is disposed so as to surround the concave portion 12, the bonding area between the external terminal 13 and the wiring of the external circuit board can be increased in an area where the concave portion 12 is surrounded. The amount of the fillet can be increased so as to surround the concave portion 12. Accordingly, the bonding strength between the wiring board 1 and the external circuit board can be improved. It is particularly preferable that an end portion of the convex-shaped section 131 is arranged outside of the wiring board 1 rather than the inner surface of the concave portion 12 on the center side of the wiring board 1.

As in the example shown in FIG. 1, when the convex-shaped section 131 includes plural convex portions, which are disposed along the concave portion, the stress applied to the external terminal 13 is further distributed by the plural convex portions, and therefore, the possibility that the wiring board 1 is peeled off from the external circuit board can be further reduced.

As in examples shown in FIG. 6 to FIG. 8 and FIG. 10, when the convex-shaped section 131 is composed of one convex portion, which is disposed along the concave portion 12, the stress applied to the external terminal 13 is distributed in a wide range by the continuous convex portion, and therefore, the possibility that the wiring board 1 is peeled off from the external circuit board can be further reduced.

As in the examples shown in FIG. 1, FIG. 6 to FIG. 8 and FIG. 10, when the convex portion has a strip shape in a plan view thereof, the stress applied to the external terminal 13 is further distributed by the convex portions even when a force in a direction horizontal to the main surface of the wiring board 1 is applied to the bonding portion, and therefore, the possibility that the wiring board 1 is peeled off from the external circuit board can be further reduced. In particular, as in the examples shown in FIG. 1, FIG. 6, FIG. 8 and FIG. 10, it is preferable that the convex-shaped section 131 has a portion extending in an x-direction and a portion extending in a y-direction. In other words, it is preferable that the convex-shaped section 131 has a shape including orthogonal portions (bending at right angles) or that the convex-shaped section 131 has plural convex portions and the plural convex portions is so configured that respective extended lines thereof are orthogonal to each other. Due to the structure, the stress applied to the external terminal 13 is effectively distributed by the convex-shaped section 131 even when forces in various directions horizontal to the main surface of the wiring board 1 is applied to the bonding portion, and therefore, the possibility that the wiring board 1 is peeled off from the external circuit board can be further reduced.

The convex-shaped section 131 can be fabricated by, for example, the following manufacturing method.

In a first manufacturing method of the convex-shaped section 131, after forming a first terminal 13d on the main surface of the insulating substrate 11 as in an example shown in FIG. 3(a), a second terminal 13e is formed in an area to be the convex-shaped section 131 on the first terminal 13d as in an example shown in FIG. 3(b), thereby the external terminal 13 having the convex-shaped section 131 can be formed.

Next, in a second manufacturing method, after forming the first terminal 13d on the area to be the convex-shaped section 131 on the main surface of the insulating substrate 11 as in an example shown in FIG. 4(a), the second terminal 13e is formed so as to cover the first terminal 13d as in an example shown in FIG. 4(b), thereby the external terminal 13 having the convex-shaped section 131 can be formed. It is preferable that the first terminal 13d is formed to have a thickness of, for example, 50% or less of a thickness of the second terminal 13e as the second terminal 13e is formed over the first terminal 13d.

Next, in a third manufacturing method, after forming the first terminal 13d on the main surface of the insulating substrate 11 as in an example shown in FIG. 5(a), the second terminal 13e is formed so as to partially overlap an end portion of the first terminal 13d as in an example shown in FIG. 5(b), thereby the external terminal 13 having the convex-shaped section 131 can be formed.

In the first to third manufacturing methods, the first terminal 13d and the second terminal 13e are formed by using the material and method similar to those of the external terminal 13. The first terminal 13d and the second terminal 13e may be formed by using the same method or may be formed by using different methods. For example, the first terminal 13d is formed with the side surface area 13b of the external terminal 13 by printing and applying a conductor paste for the first terminal 13d on the ceramic green sheet for the insulating substrate 11 and firing the conductor paste simultaneously with the ceramic green sheet for the insulating substrate 11. The second terminal 13e is formed by, for example, printing and applying a conductor paste for the second terminal 13e on the insulating substrate 11, then, firing the conductor paste to be baked on the surface of the insulating substrate 11 or depositing a metal material for the second terminal 13e on the surface of the insulating substrate 11 by using the sputtering method, the deposition method or otherwise. For example, when the side surface area 13b as well as the first terminal 13d and the second terminal 13e are formed by different methods as described above in the third manufacturing method, the bonding between the main surface area 13a and the side surface area 13b of the external terminal 13 can be strengthened, and intervals between external terminals 13 and positions of the external terminals 13 on the main surface of the wiring board 1 can be formed with accuracy.

In the second manufacturing method, the first terminal 13d may be an insulating film. The first terminal 13d fabricated by the insulating film is deposited on the area to be the convex-shaped section 131 on the main surface of the insulating substrate 11 by printing and applying a ceramic paste obtained by adding and mixing a suitable organic binder and a solvent to the ceramic power substantially similar to the one used for the insulating substrate 11 on the ceramic green sheet to be the insulating substrate 11 in a given pattern by the screen printing method in advance, and firing the ceramic paste simultaneously with the ceramic green sheet to be the insulating substrate 11.

On exposed surfaces of the external terminal 13 and the wiring conductor 14, a plating layer is deposited by an electroplating method. The plating layer is made of a metal having excellent corrosion resistance and connectivity to a connection member such as nickel, copper, gold or silver, which is formed by sequentially depositing a nickel plating layer having a thickness of approximately 0.5 to 5 μm and a gold plating layer having a thickness of approximately 0.1 to 3 μm or by sequentially depositing a nickel plating layer having a thickness of approximately 1 to 10 μm and a silver plating layer having a thickness of approximately 0.1 to 1 μm. Accordingly, the corrosion of the external terminal 13 and the wiring conductor 14 can be effectively suppressed, and the fixation of the wiring conductor 14 and the electronic component 2, the bonding between the wiring conductor 14 and the connection member 3 such as a bonding wire and the bonding between the external terminal 13 and the wiring of the external circuit board can be strengthened. By depositing a copper plating layer having a thickness of approximately 10 to 80 μm on the nickel plating layer on the wiring conductor 14 on which the electronic component 2 is mounted, dissipation of heat on the electronic component 2 may be made easier in good condition.

Additionally, by depositing the plating layer on part of surfaces of the main surface area 13a of the external terminal 13 including the convex-shaped section 131 formed by the first to third manufacturing methods so as to be thicker than on other areas of the main surface areas 13a of the external terminal 13, the convex-shaped section 131 can be formed to be higher in height and the main surface area 13a of the external terminal 13 other than the convex-shaped section 131 can be formed to have different heights partially.

It is possible to fabricate an electronic device by mounting the electronic component 2 on an upper surface of the wiring board 1. The electronic component 2 mounted on the wiring board 1 includes semiconductor devices such as an IC chip or an LSI chip, light emitting devices, piezoelectric devices such as a crystal oscillator and a piezoelectric oscillator, various sensors and the like. For example, when the electronic component 2 is a flip-chip type semiconductor device, the semiconductor device is mounted on the wiring board 1 by connecting an electrode of the semiconductor device to the wiring conductor 14 electrically and mechanically through a connection member 3 such as solder bumps, gold bumps or conductive resins (an anisotropic conductive resin and so on). When the electronic component 2 is, for example, a wire-bonding type semiconductor device, the semiconductor device is fixed to the mounting area of the electronic component by the connection member, and then mounted on the wiring board 1 by electrically connecting an electrode of the semiconductor device to the wiring conductor 14 through the connection member 3 such as the bonding wire. Plural electronic components 2 may be mounted on the wiring board 1, and a small-sized electronic component such as a resistance device or a capacitor device may be mounted according to need. The electronic component 2 is sealed by a sealant 4 made of resin or glass, a lid body or the like made of resin, glass, ceramics, metals or the like.

The wiring board 1 according to the embodiment includes the insulating substrate 11 having two main surfaces facing each other, side surfaces connecting to the two main surfaces and concave portions 12 concave from the side surfaces and connecting to at least one of the two main surfaces, and the external terminals 13 disposed from one of the main surfaces to inner surfaces of the respective concave portions 12, each of the external terminals 13 having the convex-shaped section 131 disposed on one main surface side along each of the concave portions 12. Even in the case where the force in the direction horizontal to the main surface of the wiring board 1 is applied to the bonding member when the wiring board 1 is bonded to the external circuit board through the bonding member, the stress applied from the bonding member to the external terminal 13 is distributed by the convex-shaped section 131, and therefore, the possibility that the external terminal 13 is peeled off from the bonding member can be reduced.

The electronic device according to the embodiment includes the wiring board 1 having the above-mentioned structure and the electronic component 2 mounted on the wiring board 1, and therefore, the bonding strength between the electronic device and the external circuit substrate can be improved.

Second Embodiment

Next, an electronic device according to a second embodiment of the invention will be explained with reference to FIG. 6.

The electronic device according to the second embodiment of the invention differs from the electronic device according to the first embodiment in that the external terminal 13 is disposed on the same main surface as the mounting surface of the electronic component 2 in the insulating substrate 11. In such a case, since the external terminal 13 can be bonded to the external circuit board on the upper surface side of the wiring board 1, a member having a higher thermal conductivity than the insulating substrate 11 is bonded to the entire surface on the lower surface side of the wiring board 1, and the heat radiation performance of the wiring board 1 can be improved. As materials having the higher thermal conductivity than the insulating substrate 11, for example, metal materials such as copper (Cu), copper-tungsten (Cu—W) or aluminum (Al) can be used.

The insulating substrate 11 may have an upper surface including a cavity 15 as in an example shown in FIG. 6. Such a cavity 15 can be formed by forming a through hole to be the cavity 15 in plural ceramic green sheets by the laser process, the punching process using the die or the like, and laminating these ceramic sheets on a ceramic green sheet without any through hole. When the thickness of the insulating substrate 11 is thin, the through hole for the cavity 15 is preferably formed by the laser process, the punching process using the die or the like after laminating the ceramic green sheets for performing processing with accuracy.

In the case where the cavity 15 is a space for mounting the light emitting device, an angle $\theta$ made by an inside surface of the cavity 15 and a bottom surface of the cavity 15 is an obtuse angle and, particularly, 100 degrees to 145 degrees are preferable as in the example shown in FIG. 6. When the angle $\theta$ is set in the above-mentioned range, it is easy to form the inside surface of the through hole to be the cavity 15 by the punching process stably and efficiently, and the light emitting device using the wiring board 1 can be easily miniaturized. It is also possible to radiate light emitted from the light emitting device toward the outside in good condition. The cavity 15 having the inside surface with the angle $\theta$ is formed by punching the ceramic green sheet by using a punching die which sets a clearance between a diameter of a punch and a diameter of a die hole to be large. That is, when the clearance of the diameter of the die hole is set to be larger than the diameter of the punch of the punching die, the green sheet is sheared from an edge of a contact surface with respect to the punch toward an edge of a contact surface with respect to the die hole and a diameter of the through hole is widened from the main surface side to the other main surface side when the ceramic green sheet is punched from the main surface side toward the other main surface side. At this time, the angle of the inside surface of the through hole formed in the ceramic green sheet can be adjusted by setting the clearance between the diameter of the punch and the diameter of the die hole in accordance with the thickness of the ceramic green sheet and so on. This punching method has high productivity because the angle $\theta$ made by the inside surface of the cavity 15 and the bottom surface of the cavity 15 can be set to a desired angle only by the punching process.

It is also preferable to form the through hole having the angle $\theta$ widening from one main surface side toward the other main surface side as described above by pressing a die having a frustum shape or a truncated pyramid shape onto the inside surface of the through hole after forming the through hole having the angle $\theta$ of approximately 90 degrees by the process using the punching die with a small clearance between the diameter of the punch and the diameter of the die hole. In such case, the angle $\theta$ made by the inside surface of the cavity 15 and the bottom surface of the cavity 15 can be adjusted more accurately.

When the wiring board 1 includes the insulating substrate 11 having, for example, the upper surface including the cavity 15 on which the light emitting device is mounted, it is also preferable that a reflective layer for reflecting light emitted from the light emitting device is disposed in an inner wall surface of the cavity 15. The reflective layer includes, for example, a metal conductor layer disposed in the inner wall surface of the cavity 15 and a plating layer deposited on the metal conductor layer. The metal conductor layer can be formed by the material and method similar to those of the external terminal 13 and the wiring board 14.

For example, when the light emitting device is mounted on the wiring board 1, it is preferable that a silver plating layer is deposited on the outermost surface of the metal conductor layer and a gold plating layer is deposited on the outermost surfaces of the external terminal 13 and the wiring conductor 14. This is because the gold plating layer has excellent bondability with the electronic component 2, the connection member 3 and the wiring of the external circuit board as compared with the silver plating layer and the silver plating layer has a higher reflectance with respect to light as compared with the gold plating layer. The outermost surfaces of the wiring conductor 14 and the metal conductor layer may be plated as an alloy plating layer of silver and gold, for example, as a whole solid solution-type alloy plating layer of silver and gold.

Third Embodiment

Next, an electronic device according to a third embodiment of the invention will be explained with reference to FIG. 7.

The electronic device according to the third embodiment of the invention differs from the electronic device according to the first embodiment in that an edge on the concave portion 12 side of the convex portion of the convex-shaped section 131 has an arc shape in a plan view thereof. In this case, even when the force in the direction horizontal to the main surface of the wiring board 1 is applied to the bonding portion at the time of bonding the wiring board 1 to the external circuit substrate, since there is no corner portion onto which the stress is concentrated around the convex-shaped section 131, the possibility that the external terminal 13 is peeled off from the bonding member can be reduced.

The invention is not limited to the above-mentioned embodiments and various modifications are possible. For example, the external terminal 13b is formed in the inner surface of the concave portions 12, however, part or the whole of the concave portions 12 may be filled with the external terminal 13 in a plan view thereof.

Additionally, when an edge on the concave portion 12 side of the convex portion of the convex-shaped section 131 have a similar shape to an edge of the concave portion 12 as in the example shown in FIG. 6, the stress applied to the external terminal 13 is distributed more effectively by the convex-shaped section 131 arranged continuously in a wide range even in the case where the force in the direction horizontal to the main surface of the wiring board 1 is applied to the bonding portion, thereby the possibility that the wiring board 1 is peeled off from the external circuit board can be further reduced.

Figure 8:
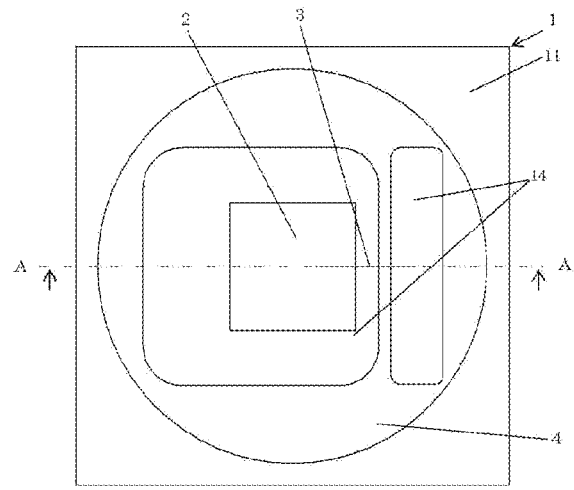
FIG. 8(a) is another example of a top view showing the wiring board according to the first embodiment of the invention.
FIG. 8(b) is a bottom view of FIG. 8(a)
Figure 8:
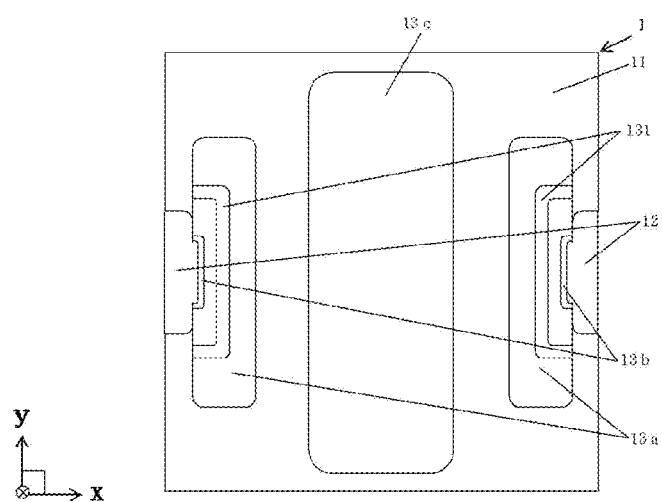
Figure 9:
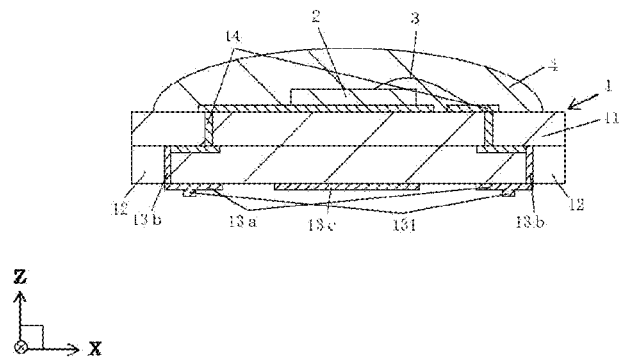
FIG. 9 is a cross-sectional view taken along the line A-A of the wiring board shown in FIG. 8(a)
Figure 10:
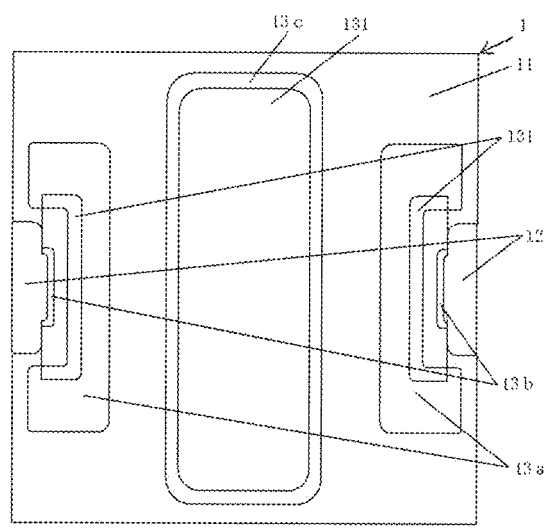
FIG. 10 is another example of a bottom view showing the wiring board according to the first embodiment of the invention.

A central terminal 13c may be provided as in examples shown in FIG. 8 to FIG. 10. The central terminal 13c can be fabricated by the material and method similar to those of the above-mentioned external terminal 13 and the wiring conductor 14, and on an exposed surface thereof, the plating layer similar to those deposited on the external terminal 13 and the wiring conductor 14 is deposited. The central terminal 13c is used, for example, for the bonding of the external circuit board in the same manner as the external terminal 13.

In the example shown in FIG. 8, a lower surface of the central terminal 13c is formed so as to be lower than the convex-shaped section 131 of the external terminal 13 formed along the convex portions 12, however, the convex-shaped section 131 may be also disposed at the central portion of the central terminal 13c so that the central terminal 13 has the same height as or is higher than the convex-shaped section 131 of the external terminal 13 as shown in an example shown in FIG. 10. The convex-shaped section 131 of the central terminal 13c can be fabricated by the same method of the convex-shaped section 131 of the external terminal 13.

As in the examples shown in FIG. 8 to FIG. 10, an interval between the concave portion 12 and the convex-shaped section 131 in the vicinity of the central portion of the concave portion 12 is set to be narrower than an interval between the concave portion 12 and the convex-shaped section 131 at an edge portion of the concave portion 12, thereby the bonding area between the external terminal 13 and the wiring of the external circuit board around the concave portion 12 in the vicinity of the central portion of the concave portion 12 can be increased and variations in the displacement of the wiring board 1 at the time of bonding the board to the external circuit board can be reduced.

In the case where the convex-shaped section 131 is disposed in the central terminal 13c, the mounting area of the electronic component 2 is formed inside the convex-shaped section 131 of the central terminal 13c in a plan view thereof, since the heat of the electronic component 2 is transmitted to the external circuit board through the central terminal 13c in good condition, the wiring board 1 having good heat-radiation performance can be obtained.

Moreover, the thicknesses of the external terminal 13 can be different from each other on the outer peripheral side and the central portion side with respect to the convex-shaped section 131 taken as a boundary. When the thickness of the external terminal 13 on the outer peripheral side is thinner than the thickness of the external terminal 13 on the central portion side with respect to the convex-shaped section 131 taken as a boundary, the bonding area between the external terminal 13 and the wiring of the external circuit board around the concave portion 12 can be increased. Additionally, the bonding strength can be improved by forming fillets around the convex-shaped section 131 easily. Furthermore, since the thickness of the external terminal 13 on the central portion side is thicker, the heat radiation performance on the central side of the wiring board 1 can be increased.

An end portion of the main surface area 13a may be positioned on the outer side of the wiring board 1 rather than the convex-shaped section 131 as in the example shown in FIG. 10.

The wiring board 1 can be the one which is bonded to the insulating substrate by forming a through hole in the insulating substrate and fitting a metal member with a better heat radiation performance than the insulating substrate 11 on which the electronic component 2 is mounted to the through hole, or can be the one in which the metal member with the better heat radiation performance than the insulating substrate 11 is embedded inside the insulating substrate 11 in an area overlaid on the area on which the electronic component 2 is mounted in a plan view thereof.

The wiring board 1 may be fabricated in a form of a multi-piece wiring board.

REFERENCE SIGNS LIST

1: Wiring board
11: Insulating substrate
12: Concave portion
13: External terminal
131: Convex-shaped section
13a: Main surface area
13b: Side surface area
13c: Central terminal
13d: First terminal
13e: Second terminal 14: Wiring conductor
15: Cavity
2: Electronic component
3: Connection member
4: Sealant

The invention claimed is:

1. A wiring board, comprising:
an insulating substrate having two main surfaces facing each other, side surfaces perpendicular to and connecting to the two main surfaces, and concave portions that are concave into the side surfaces and that connect to at least one of the two main surfaces; and
external terminals disposed from one of the main surfaces to inner surfaces of the respective concave portions, each of the external terminals comprising a main surface area which is located on the one of the main surfaces and has a convex-shaped section, that is convex out from the one of the main surfaces, disposed along each of the concave portions, an interval between the concave portion and the convex-shaped section disposed along the concave portion at a central portion of the concave portion being narrower than an interval between the concave portion and the convex-shaped section disposed along the concave portion at an edge portion of the concave portion.

2. The wiring board according to claim 1, wherein the respective convex-shaped sections comprise plural convex portions, which are disposed along each of the concave portions.

3. The wiring board according to claim 2, wherein each of the convex portions has a strip shape in a plan view thereof.

4. The wiring board according to claim 2, wherein an edge on a concave portion side of each of the convex portions has an arc shape in a plan view thereof.

5. The wiring board according to claim 1, wherein each of the convex-shaped sections is composed of one convex portion, which is disposed along each of the concave portions.

6. The wiring board according to claim 5, wherein an edge on a concave portion side of the one convex portion has a similar shape to an edge of the concave portion in a plan view thereof.

7. The wiring board according to claim 5, wherein the one convex portion has a strip shape in a plan view thereof.

8. The wiring board according to claim 5, wherein an edge on a concave portion side of the one convex portion has an arc shape in a plan view thereof.

9. An electronic device, comprising:
the wiring board according to claim 1; and
an electronic component mounted on the wiring board.

* * * * *